US007211364B1

(12) United States Patent
Landry-Coltrain et al.

(10) Patent No.: US 7,211,364 B1
(45) Date of Patent: May 1, 2007

(54) THERMALLY CONDUCIVE MATERIAL AND USE IN HIGH-SPEED PRINTING

(75) Inventors: Christine J. Landry-Coltrain, Fairport, NY (US); Linda M. Franklin, Rochester, NY (US)

(73) Assignee: Eastman Kodak Company, Rochester, NY (US)

( * ) Notice: Subject to any disclaimer, the term of this patent is extended or adjusted under 35 U.S.C. 154(b) by 0 days.

(21) Appl. No.: 11/256,253

(22) Filed: Oct. 21, 2005

(51) Int. Cl.

| | |
|---|---|
| ***G03F 7/34*** | (2006.01) |
| ***B41M 5/20*** | (2006.01) |
| ***C08L 1/10*** | (2006.01) |
| ***C08K 3/18*** | (2006.01) |
| ***C08K 3/04*** | (2006.01) |

(52) U.S. Cl. ................ 430/201; 106/170.58; 428/32.8; 428/32.86; 428/32.64; 428/32.69; 428/32.74; 428/32.85; 503/207; 503/227; 524/430; 524/437; 524/496; 524/500; 524/504; 524/505

(58) Field of Classification Search ............. 428/32.64, 428/32.69, 32.74, 32.8, 32.86, 32.85; 430/201; 503/207, 227; 106/170.58; 524/430, 437, 524/496, 500, 504, 505

See application file for complete search history.

(56) References Cited

U.S. PATENT DOCUMENTS

| | | | | |
|---|---|---|---|---|
| 4,826,717 | A | 5/1989 | Kohashi et al. | |
| 5,484,838 | A * | 1/1996 | Helms et al. | 524/496 |
| 5,844,037 | A * | 12/1998 | Lundgard et al. | 524/496 |
| 5,898,018 | A | 4/1999 | Hirano et al. | |
| 6,303,228 | B1 | 10/2001 | Watanabe et al. | |
| 6,475,696 | B2 * | 11/2002 | Majumdar et al. | 430/201 |
| 6,476,842 | B1 | 11/2002 | Chang | |
| 6,565,965 | B1 * | 5/2003 | Harada et al. | 428/328 |
| 2003/0211253 | A1 | 11/2003 | Torri et al. | |
| 2005/0134656 | A1 * | 6/2005 | Gao | 347/71 |
| 2005/0137089 | A1 * | 6/2005 | Gao et al. | 503/227 |

FOREIGN PATENT DOCUMENTS

| | | |
|---|---|---|
| EP | 02-127081 | 5/1990 |
| EP | 0 383 267 | 6/1995 |
| EP | 0 707 979 | 1/1999 |
| EP | 0 909 659 | 4/1999 |
| EP | 0 900 659 | 12/2002 |
| JP | 61-237687 | 10/1986 |
| JP | 62-001584 | 1/1987 |
| JP | 62-039292 | 2/1987 |
| JP | 63-182189 | 7/1988 |
| JP | 05-024368 | 2/1993 |
| JP | 10-226751 | 8/1998 |
| JP | 1998226751 | 8/1998 |

OTHER PUBLICATIONS

F. Gubbels, R. Jerome, Ph. Teyssie, E., Vanlathem, R. Deltour, A., Calderone, V. Parente, J.L. Bredas; "Selective Localization of Carbon Black in Immiscible Polymer Blends: A Useful Tool To Design Electrical Conductive Composite"; Macromolecules 1994, vol. 27, No. 7, 1972-1974.

* cited by examiner

*Primary Examiner*—Richard L. Schilling
(74) *Attorney, Agent, or Firm*—Kathleen Neoner Manne; Lynn M. Blank

(57) ABSTRACT

A thermally conductive material, a donor element including the material, a method of printing using the donor element, and a print assembly including the donor element are described, wherein the thermally conductive material includes at least two immiscible or incompatible organic polymers, or a block or graft copolymer, wherein the constituent homopolymer repeat units that form the copolymer are prepared from chemical species that would form mutually immiscible or incompatible polymers, and thermally conductive particles having a short axis of less than or equal to 0.2 microns.

28 Claims, No Drawings

THERMALLY CONDUCIVE MATERIAL AND USE IN HIGH-SPEED PRINTING

FIELD OF THE INVENTION

A thermally conductive material, its use in donor element suitable for use at high print speeds, a printer assembly including the donor element, and a method of printing using the donor element are described.

BACKGROUND OF THE INVENTION

Thermal transfer systems have been developed to obtain prints from pictures that have been generated electronically, for example, from a color video camera or digital camera. An electronic picture can be subjected to color separation by color filters. The respective color-separated images can be converted into electrical signals. These signals can be operated on to produce cyan, magenta, and yellow electrical signals. These signals can be transmitted to a thermal printer. To obtain a print, a black, cyan, magenta, or yellow donor layer, for example, can be placed face-to-face with a dye image-receiving layer of a receiver element to form a print assembly, which can be inserted between a thermal print head and a platen roller. A thermal print head can be used to apply heat from the back of the donor sheet. The thermal print head can be heated up sequentially in response to the black, cyan, magenta, or yellow signals. The process can be repeated as needed to print all colors, and a laminate or protective layer, as desired. A color hard copy corresponding to the original picture can be obtained. Further details of this process and an apparatus for carrying it out are contained in U.S. Pat. No. 4,621,271 to Brownstein.

Thermal transfer works by transmitting heat through the donor from the back-side to the donor layer. When the colorant in the donor layer is heated sufficiently, it sublimes or diffuses, transferring to the adjacent dye-receiving layer of the receiver element. The density of the colorant forming the image on the receiver can be affected by the amount of colorant transferred, which in turn is affected by the amount of colorant in the dye donor layer, the heat the dye donor layer attains, and the length of time for which the heat is maintained at any given spot on the donor layer.

At high printing speeds, considered to be 2.0 msec/line or less, the print head undergoes heat on/off cycles very rapidly. This generated heat must be driven through the donor support assemblage very rapidly to affect the colorant transfer from the donor to the receiver. Each layer in the donor can act as an insulator, slowing down the heat transfer through the layers of the donor to the receiver. Because of the short heat application time, any reduction in heat transfer efficiency results in a lower effective temperature in the donor layer during printing, which can result in a lower transferred colorant density. It is known to overcome the low print density associated with shorter line times by increasing the printhead voltage, increasing the relative amount of colorant in the donor layer, or a combination thereof. Applying higher print head voltages can decrease the lifetime of the thermal print head, and requires a higher power supply, both of which increase cost. Increasing the relative amount of colorant in the donor layer increases costs, as well as increasing the chance of unwanted colorant transfer, such as during storage of a donor element, as well as increasing donor-receiver sticking during printing.

To increase the thermal flux through the donor element, it is known to add thermally conductive agents, such as metallic particles, graphite, or carbon black, that will increase thermal conductivity of the support, intermediate layers, and dye donor layers. Increasing the thermal conductivity in the direction perpendicular to the plane of the donor element allows more heat to transfer through the thickness of the donor element in less time, enabling the use of less heat, less time, or both, to print an image. However, it is critical to minimize the amount of thermally conductive agents added to these layers to minimize any adverse effects that they may have on the physical and optical properties of the layers, and to keep costs low.

U.S. Patent Application Publications Nos. 2005-0134656A1 to Gao and 2005-0137089A1 to Gao et al. disclose that a polymeric material including thermally conductive inorganic particles can be in a layer between the donor layer and the support, the support, a layer beneath the support, or a combination thereof, to increase thermal conductivity of the donor element.

EP 0909659 discloses a dye donor element that has a support comprising a low thermal conductivity matrix and a plurality of high thermal conductivity particles dispersed in the matrix. This provides high thermal conductivity perpendicular to the plane of the donor element, and low thermal conductivity parallel to the plane of the donor element. There is a significant increase in materials cost as well as manufacturing challenges associated with this approach because the support is much thicker than any of the other layers in the donor element.

U.S. Pat. No. 6,476,842 B1 discloses the use of carbon black as a thermally conductive material in layers of a thermal donor other than the donor layer. US Patent Application Publication US2003/021153A1 discloses the use of carbon black or metals as thermally conductive patches in the donor layer. The addition of carbon black or colored metallic particles, such as Au, Ag, Cu, Pd, Pt, Ni, and graphite, can add color to the thermal donor element. This is undesirable because color sensors are used in the thermal dye transfer printers to detect which color patch is in line to be printed. Often, the donor element will contain a plurality of black marking lines that are utilized by the printer for alignment and registration purposes. If the dye donor layers become too black, such as when metallic or carbon black particles are added, then the printer cannot distinguish the colorant patches from the registration marks.

U.S. Pat. No. 4,826,717 discloses a dye layer containing inorganic particles of the same size as, or larger than, the thickness of the dye layer, wherein the entire dye layer is transferred to the dye receiving layer upon printing. There is a problem with this in that the particle size is too large. The particles provide thermal transfer pathways through the dye layer directly through the particles without actually heating the dye/binder part of the dye layer, which is necessary to effect dye transfer.

There is a need in the art for a means of increasing thermal conductivity of a material, such as for use in a donor element, increasing transferred colorant density of a donor element, and increasing print speed of a donor element while 1) maintaining or increasing print density, such as by increased colorant transfer efficiency, 2) maintaining or reducing power to the print head, 3) maintaining or reducing manufacturing cost, and 4) maintaining the optical properties (color and transparency) and physical properties of the donor colorant patches.

SUMMARY OF THE INVENTION

A thermally conductive material is disclosed, wherein the material comprises at least two immiscible or incompatible organic polymers, or a block or graft copolymer wherein the constituent blocks or grafts are prepared from chemical species that would form mutually immiscible or incompatible polymers, and thermally conductive particles having a short axis of less than or equal to 0.2 microns. Also disclosed is a thermal donor element comprising a support, a donor layer, and optionally a slip layer on a side of the support opposite the donor layer, wherein at least one layer comprises the thermally conductive material.

ADVANTAGES

A thermally conductive material, use of the same in a donor element, and a method of printing using the donor element are provided, wherein use of the material in the donor element enables fast printing while maintaining or increasing print density, maintaining or reducing power to the print head, maintaining or reducing manufacturing cost, and maintaining the optical properties (color and transparency) and physical properties of the donor colorant patches. The material provides increased thermal conductivity and, when used in one or more layer of the donor element, increases transferred colorant density.

DETAILED DESCRIPTION OF THE INVENTION

A thermally conductive material is described, wherein the material can be used to increase conductivity of heat through an object containing the material, such as a thermal donor element. The thermally conductive material can include a block or graft copolymer wherein the constituent blocks or grafts are prepared from chemical species that would form polymers that would be mutually immiscible or incompatible, or a mixture of at least two organic polymers that are mutually immiscible or incompatible, and thermally conductive particles.

A copolymer is defined as a polymer derived from more than one chemical species of monomer repeat units. Block copolymers are defined as linear copolymers wherein the repeat units exist only in long sequences, or blocks, of the same chemical species. Graft copolymers are branched polymers wherein the branches consist of long sequences of repeat units that have a different chemical structure to those of the main backbone chain. In their simplest form, they consist of a main chain homopolymer with branches of a different homopolymer. In general, block or graft copolymers are prepared such that the long sequences of repeat units of one block of the block copolymer (or the branches of the graft copolymer) are immiscible or incompatible with the long sequences of repeat units of the other block of the block copolymer (or the backbone of the graft copolymer). See "Introduction to Polymers" by R. J. Young and P. A. Lovell, $2^{nd}$ edition, Chapman & Hall, London, 1991.

"Immiscible or incompatible" is defined as separating into distinct phases when mixed. The size scale of the phase separation can be microscopic (less than one micron phase domains) or macroscopic (greater than one micron phase domains). The immiscibility of two polymers can be detected by traditional methods known in the art, for example, measuring two distinct glass transition temperatures, one corresponding to each polymer phase, or, for amorphous polymers, by observing an increase in light scattering or a decrease in transparency of the mixture relative to that of the individual polymers. It is preferred that the domain size of the polymer—polymer or copolymer phase separation remain on the microscopic level so as to maintain uniformity in the appearance of the thermally conductive material, for example, when coated as a layer in an article.

The thermally conductive material can include a mixture of at least two immiscible or incompatible polymers, or it can include a block or graft copolymer wherein the constituent blocks or grafts are prepared from chemical species that would form polymers that would be mutually immiscible or incompatible. Each of the polymers, or blocks or grafts of the copolymer, individually can be selected from, for example, a polycarbonate, a polyester, a polyurethane, a poly(sulfone), a poly(phenylene oxide), cellulose derivatives, polyvinylacetals, vinyl-chloride-containing polymers, styrene-containing polymers, and acrylate-containing polymers. For example, suitable cellulose derivatives can include, but are not limited to, cellulose ester, cellulose ether, and cellulose nitrate polymers, for example, acetate hydrogen phthalate cellulose, cellulose acetate, cellulose acetate propionate, cellulose acetate butyrate, cellulose triacetate, cellulose nitrate, ethylcellulose, methylcellulose, and hydroxyalkyl celluloses such as hydroxypropyl cellulose, methylhydroxypropyl cellulose, and hydroxypropylmethyl cellulose. Suitable styrenic and acrylic co-binder polymers can include, but are not limited to, for example, poly(styrene-co-acrylonitrile), polystyrene, poly(methyl acrylate), poly(methyl methacrylate), poly(phenyl methacrylate), poly(butyl methacrylate), and poly(butyl acrylate). Suitable polyacetal polymers and copolymers can include, but are not limited to, for example, poly(vinylacetal), poly(vinylbutyral), poly(vinylpental), poly(vinylhexal), poly(vinylheptal), poly(vinylbutyral-co-vinylhexal), poly(vinylbutyral-co-vinylheptal), poly(vinylbutyral-co-vinyloctal), and poly(vinylbutyral-co-vinylnaphthal). Combinations of any two or more polymers can be used. According to certain embodiments, the thermally conductive material can include ethylcellulose. The ethylcellulose can have an ethoxyl content between 45 and 53%, preferably between 48 and 52%, and a solution viscosity of between 2 and 200 centipoise, for example, between 10 and 150 centipoise, as measured by a 5 wt. % solution in an 80/20 wt. % mixture of toluene and ethanol at 25° C. Mixtures of various ethylcellulose grades can be used. The weight ratio of the two polymers can be from 90:10 to 10:90 by weight, for example, from 75:25 to 25:75, or from 60:40 to 40:60.

The thermally conductive material can include thermally conductive particles. For example, the thermally conductive material can include carbon or metal oxide particles, such as but not limited to aluminum oxide (alumina), for example, colloidal aluminum oxide, fumed aluminum oxide, boehmite alumina, or gamma-aluminum oxide; alumina-coated silicon oxide; allophanes; and mixtures of aluminum oxide with silicon oxide, zirconium oxide, or titanium oxide. Carbon nanotubes, including single-walled carbon nanotubes (SWNT), double-walled carbon nanotubes, multi-walled carbon nanotubes, surface-treated carbon nanotubes, and organically modified carbon nanotubes are all suitable for use as thermally conductive particles. The thermally conductive particles can also include metal nanowires, such as silver, copper, or aluminum nanowires.

Suitable alumina particles can be purchased as powders that need to be dispersed, or as pre-dispersed slurries. Sources of alumina particles can include Catapal™ sold by SASOL North America Inc. (TX) and Vista Chemical Company (TX), Aluminum Oxide C sold by Degussa AG (Germany), and Disperal™ and Dispal™ sols and dispersions sold by Condea Vista Chemical Company (TX).

Suitable carbon nanotubes can be purchased from, for example, Hyperion Catalysis International (MA), Carbon Solutions, Inc. (CA), Zyvex Corporation (TX), Xintek, Inc (NC), and Helix Material Solutions, Inc. (TX). Carbon nanotubes suitable for use herein can have an aspect ratio of length to diameter of from 1 to 1000 or more, with a short axis of from 0.001 to 0.2 μm. Both single-walled nanotubes (SWNT) and multi-walled nanotubes (MWNT) can be used. The carbon nanotubes can have a thermal conductivity of greater than or equal to 1000 W/mK, for example, greater than 2000 W/mK. Carbon nanowires of similar dimensions to the nanotubes can also be used.

The thermally conductive particles can be round, spherical, aspherical, cylindrical, oval, or any other suitable shape. The particles can consist of agglomerates of smaller particles The particles can be 0.005 μm to 0.2 μm in primary particle size, where the primary particle size is the size of an un-aggregated particle. The particles can form aggregates or clusters. If the particle shape is elongated or non-spheroidal, the particle size according to this invention is determined by the diameter of the particle along its shortest axis. The particles can have a shortest diameter of from 0.005 μm to 0.2 μm.

The thermally conductive particles can be added to the thermally conductive material in amounts of 0.1 to 40 wt. %, for example, from 0.5 to 30 wt. %, or from 1.0 to 20 wt. %, relative to the total dry weight of all components of the material, or of a layer including the material. It is advantageous to use the lowest amount of particles needed to effect thermal conductivity so as not to alter any other physical or optical property of the material, or a layer or article comprising the material.

During coating of the thermally conductive material, drying, or both, the particles can self-aggregate and form chains or more complex structures in the material. In a typical mixture of well-dispersed particles and a polymer, the particles can be randomly positioned throughout the thermally conductive material. A significant volume % of particles are needed to form a thermally conductive pathway through the entire thickness of the material. The minimum amount of particles needed to form a continuous pathway of particles through a defined volume is defined as the percolation threshold. See, for example, *Macromolecules* 1994, 27, pp. 1972–1974, by Gubbels et al. Needing too large an amount of particles to form the continuous pathway can create problems such as increased brittleness or decreased transparency of the material, or an article including the material. In addition, a significant increase in the total amount of materials needed to form the thermally conductive material will increase cost and thickness of the thermally conductive material and any article including it. When two or more polymers that are immiscible or incompatible are mixed, or a block or graft copolymer is used, separate phase domains can develop in the thermally conductive material. The phase domains can have dual-phase co-continuity, wherein the separate phases each can be co-continuous throughout the layer. Thermally conductive particles can organize themselves along the interfacial regions, or phase boundaries, between the phases. This significantly lowers the volume % of thermally conductive particles needed to reach the percolation threshold and affect the thermal conductivity of the thermally conductive material.

A dispersing agent or wetting agent optionally can be present to facilitate the dispersion of the thermally conductive particles in the block or graft copolymer, or mixture of at least two organic polymers, of the thermally conductive material. This helps to minimize agglomeration of the particles. Useful dispersing agents include, but are not limited to, fatty acid amines; commercially available wetting agents such as Solsperse™ from Avecia Inc. (DE); nonionic fluorinated alkyl esters such as Zonyl™-FSN, Zonyl™-FTS, Zonyl™-TBS, and Zonyl™-BA from E.I. DuPont de Nemours (DE); polysiloxanes such as DC 1248, DC200, DC510, and DC 190 from Dow Corning (MI), BYK 320 and BYK 322 from BYK Chemie (Germany); SF 1079, SF 1023, SF 1054, and SF 1080 sold by General Electric (NY); Silwet and Triton X surfactants sold by Union Carbide (now Dow Chemical (MI)); polyoxyehylene-lauryl ether surfactants sold by Eastman Kodak Company (NY); sorbitan laurate, palmitate and stearates such as Span surfactants sold by Aldrich (WI); amine-containing surfactants; and others known to practitioners in the art.

A donor element including a donor layer on a support, and optionally a slip layer on a side of the support opposite the donor layer, can include a thermally conductive material in one or more layer of the donor element. The layer including the thermally conductive material can be the donor layer, the slip layer, another layer in the donor element, or a combination thereof.

The donor layer can include one or more colored areas (patches) containing colorants suitable for thermal printing. As used herein, a "colorant" can be one or more dye, pigment, or a combination thereof, and can optionally be in a binder or carrier as known to practitioners in the art. During thermal printing, at least a portion of one or more colored areas can be imagewise transferred to the receiver element, forming a colored image on the receiver element. The donor layer can include a laminate area (patch) having no colorant. The laminate area can follow one or more colored areas. During thermal printing, the entire laminate area can be transferred to the receiver element. The donor layer can include one or more colored areas and one or more laminate areas. For example, the donor layer can include three color patches, for example, yellow, magenta, and cyan, and a clear laminate patch, for forming a full color image with a protective laminate layer on a receiver element.

Any colorant transferable by heat can be used in the donor layer of the donor element. The colorant can be selected by taking into consideration hue, lightfastness, and solubility of the colorant in the dye donor layer binder and the dye image receiving layer binder. Examples of suitable colorants can include, but are not limited to, diarylmethane dyes; triarylmethane dyes; thiazole dyes, such as 5-arylisothiazole azo dyes; methine dyes such as merocyanine dyes, for example, aminopyrazolone merocyanine dyes; azomethine dyes such as indoaniline, acetophenoneazomethine, pyrazoloazomethine, imidazoleazomethine, imidazoazomethine, pyridoneazomethine, and tricyanopropene azomethine dyes; xanthene dyes; oxazine dyes; cyanomethylene dyes such as dicyanostyrene and tricyanostyrene dyes; thiazine dyes; azine dyes; acridine dyes; azo dyes such as benzeneazo, pyridoneazo, thiopheneazo, isothiazoleazo, pyrroleazo, pyrraleazo, imidazoleazo, thiadiazoleazo, triazoleazo, and disazo dyes; arylidene dyes such as alpha-cyano arylidene pyrazolone and aminopyrazolone arylidene dyes; spiropyran dyes; indolinospiropyran dyes; fluoran dyes; rhodaminelactam dyes; naphthoquinone dyes, such as 2-carbamoyl-4-[N-(p-substituted aminoaryl)imino]-1,4-naphthaquinone; anthraquinone dyes; and quinophthalone dyes. Specific examples of colorants usable herein can include:

C.I. (color index) Disperse Yellow 51, 3, 54, 79, 60, 23, 7, and 141;

C.I. Disperse Blue 24, 56, 14, 301, 334, 165, 19, 72, 87, 287, 154, 26, and 354;

C.I. Disperse Red 135, 146, 59, 1, 73, 60, and 167;

C.I. Disperse Orange 149;

C.I. Disperse Violet 4, 13, 26, 36, 56, and 31;

C.I. Disperse Yellow 56, 14, 16, 29, 201 and 231;

C.I. Solvent Blue 70, 35, 63, 36, 50, 49, 111, 105, 97, and 11;

C.I. Solvent Red 135, 81, 18, 25, 19, 23, 24, 143, 146, and 182;

C.I. Solvent Violet 13;

C.I. Solvent Black 3;

C.I. Solvent Yellow 93; and

C.I. Solvent Green 3.

Further examples of sublimable or diffusible colorants that can be used include anthraquinone dyes, such as Sumikalon Violet RS® (product of Sumitomo Chemical Co., Ltd.), Dianix Fast Violet 3R-FS® (product of Mitsubishi Chemical Corporation.), and Kayalon Polyol Brilliant Blue N-BGM® and KST Black 146® (products of Nippon Kayaku Co., Ltd.); azo dyes such as Kayalon Polyol Brilliant Blue BM®, Kayalon Polyol Dark Blue 2BM®, and KST Black KR® (products of Nippon Kayaku Co., Ltd.), Sumickaron Diazo Black 5G® (product of Sumitomo Chemical Co., Ltd.), and Miktazol Black 5GH® (product of Mitsui Toatsu Chemicals, Inc.); direct dyes such as Direct Dark Green B® (product of Mitsubishi Chemical Corporation) and Direct Brown M® and Direct Fast Black D® (products of Nippon Kayaku Co. Ltd.); acid dyes such as Kayanol Milling Cyanine 5R® (product of Nippon Kayaku Co. Ltd.); and basic dyes such as Sumicacryl Blue 6G® (product of Sumitomo Chemical Co., Ltd.), and Aizen Malachite Green® (product of Hodogaya Chemical Co., Ltd.); magenta dyes of the structures

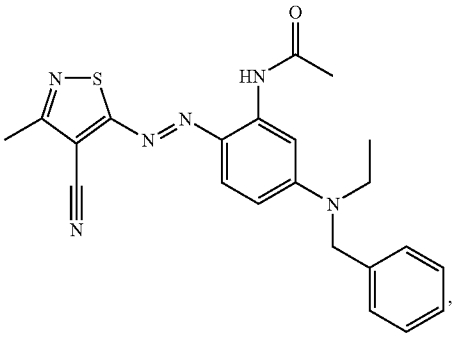

, and

-continued

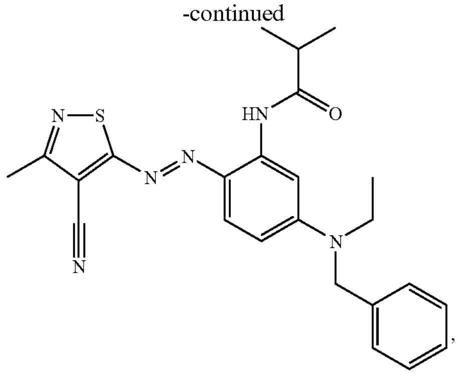

,

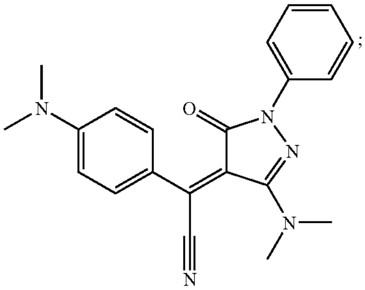

;

cyan dyes of the structures

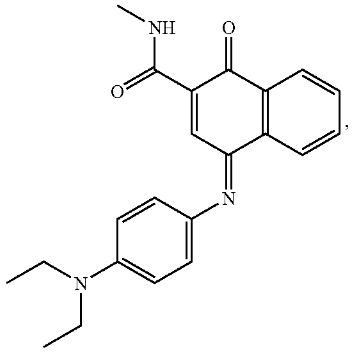

,

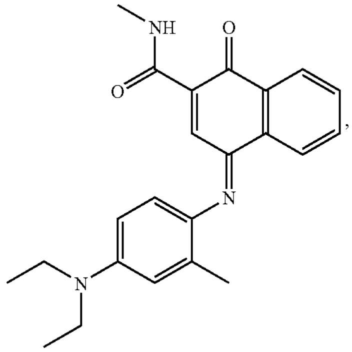

,

-continued

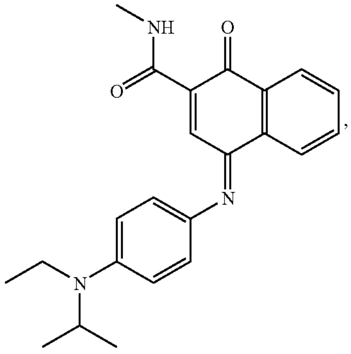

, and

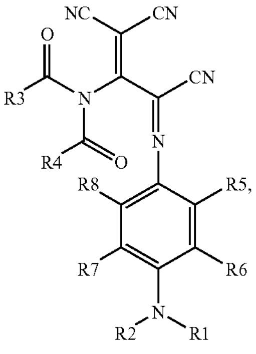

where R1 and R2 each independently represents an alkyl group, a cycloalkyl group, an aryl group, a heterocyclic group, or R1 and R2 together represent the necessary atoms to close a heterocyclic ring, or R1 and/or R2 together with R6 and/or R7 represent the necessary atoms to close a heterocyclic ring fused on the benzene ring; R3 and R4 each independently represents an alkyl group, or an alkoxy group; R5, R6, R7 and R8 each independently represents hydrogen, an alkyl group, a cycloalkyl group, an aryl group, an alkoxy group, an aryloxy group, a carbonamido group, a sulfamido group, hydroxy, halogen, $NHSO_2R_9$, $NHCOR_9$, $OSO_2R_9$, or $OCOR_9$, or R5 and R6 together and/or R7 and R8 together represent the necessary atoms to close one or more heterocyclic ring fused on the benzene ring, or R6 and/or R7 together with R1 and/or R2 represent the necessary atoms to close a heterocyclic ring fused on the benzene ring; and R9 represents an alkyl group, a cycloalkyl group, an aryl group and a heterocyclic group; and yellow dyes of the structures

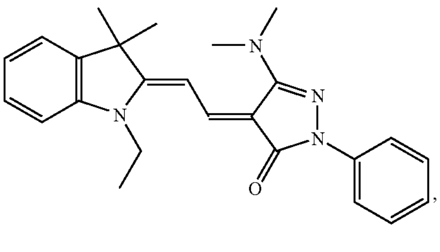

, and

-continued

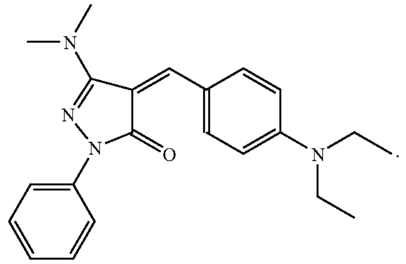

Further examples of useful colorants can be found in U.S. Pat. Nos. 4,541,830; 4,824,437; 4,910,187; 4,923,846; 5,026,677; 5,101,035; 5,142,089; 5,476,943; 5,804,531; and 6,265,345, and U.S. Patent Application Publication No. US 20030181331. Suitable cyan colorants can include Kayaset Blue 714 (Solvent Blue 63, manufactured by Nippon Kayaku Co., Ltd.). Phorone Brilliant Blue S-R (Disperse Blue 354, manufactured by Sandoz K. K.), and Waxoline AP-FW (Solvent Blue 36, manufactured by ICI). Suitable magenta colorants can include MS Red G (Disperse Red 60, manufactured by Mitsui Toatsu Chemicals, Inc.), and Macrolex Violet R (Disperse Violet 26, manufactured by Bayer). Suitable yellow colorants can include Phorone Brilliant Yellow S-6 GL (Disperse Yellow 231, manufactured by Sandoz K. K.) and Macrolex Yellow 6G (Disperse Yellow 201, manufactured by Bayer). The colorants can be employed singly or in combination to obtain a monochrome donor layer or a black donor layer. The colorants can be used in an amount of from 0.02 $g/m^2$ to 1 $g/m^2$ of coverage. According to various embodiments, the colorants can be hydrophobic.

Each donor layer colorant patch can range from 20 wt. % to 90 wt. % colorant, relative to the total dry weight of all components in the layer. A high amount of colorant is desirable for increased efficiency, but higher amounts of colorant can lead to increased occurrences of donor/receiver sticking or colorant phase separation from the binder during keeping of the donor element. Depending on the efficiency of the donor layer, a lower amount of colorant can be used to achieve the same efficiency as a different donor layer. The colorant percent is ideally chosen in view of the specific donor and receiver combination. Varying the amount of colorant in the donor can aid in matching the efficiency between different colorant patches, for example, a cyan, magenta, and yellow patch. For example, yellow and/or magenta patch colorant amounts can be between 20 wt. % and 75 wt. % colorant relative to the total dry weight of all components in the layer, for example, between 30 wt. % and 60 wt. %. A cyan patch colorant amount can be between 40 wt. % and 90 wt. % colorant relative to the total dry weight of all components in the layer, for example, between 55 wt. % and 75 wt. %.

To form a donor layer, one or more colorants can be dispersed in a polymeric binder. The binder can include one or more polymers, for example, a polycarbonate, a polyester, a polyurethane, a poly(sulfone), a poly(phenylene oxide), cellulose derivatives, polyvinylacetals, vinyl-chloride-containing polymers, styrene-containing polymers, and acrylate-containing polymers. For example, suitable cellulose derivatives can include, but are not limited to, cellulose ester, cellulose ether, and cellulose nitrate polymers, for example, acetate hydrogen phthalate cellulose, cellulose acetate, cellulose acetate propionate, cellulose acetate butyrate, cellulose triacetate, cellulose nitrate, ethylcellulose, methylcellulose, and hydroxyalkyl celluloses such as hydroxypropyl cellulose, methylhydroxypropyl cellulose, and hydroxypropylmethyl cellulose. Suitable styrenic and acrylic co-binder polymers can include, but are not limited to, for example, poly(styrene-co-acrylonitrile), polystyrene, poly methyl acrylate), poly(methyl methacrylate), poly(phenyl methacrylate), poly(butyl methacrylate), and poly(butyl acrylate). Suitable polyacetal polymers and copolymers can include, but are not limited to, for example, poly(vinylacetal), poly(vinylbutyral), poly(vinylpental), poly(vinylhexal), poly(vinylheptal), poly(vinylbutyral-co-vinylhexal), poly(vinylbutyral-co-vinylheptal), poly(vinylbutyral-co-vinyloctal), and poly(vinylbutyral-co-vinylnaphthal). Combinations of any one or more co-binder can be used. According to certain embodiments, the binder can include ethylcellulose. The ethylcellulose can have an ethoxyl content between 45 and 53%, preferably between 48 and 52%, and a solution viscosity of between 2 and 200 centipoise, for example, between 10 and 150 centipoise, as measured by a 5 wt. % solution in an 80/20 wt. % mixture of toluene and ethanol at 25° C. Mixtures of various ethylcellulose grades can be used. The binder can include the thermally conductive material, alone or in combination with another suitable binder. The binder can be used in an amount of from 0.05 $gm^{-2}$ to 5 $gm^{-2}$, for example, from 0.1 $gm^{-2}$ to 1.5 $gm^{-2}$.

The donor layer can include carbon nanotubes. Equivalent performance can be achieved when the donor layer includes a polymeric binder of a single polymer and carbon nanotubes as compared to a binder including the thermally conductive material. This is because the aspect ratio of the carbon nanotubes is very large, allowing for a very low percolation threshold for the well-dispersed carbon nanotubes.

The total amount of binder in the donor layer can be greater than 20% by weight, for example, greater than 40%, greater than 60%, greater than 70%, greater than 80%, greater than 90% or greater than 95% by weight of the total weight of the donor layer. The donor layer of the donor element can be formed or coated on a support. The donor layer composition can be dissolved in a solvent for coating purposes. The donor layer can be formed or coated by techniques such as, but not limited to, a gravure process, spin-coating, solvent-coating, extrusion coating, or other methods known to practitioners in the art.

The support of the donor element can be formed of any material capable of withstanding the heat of thermal printing. According to various embodiments, the support can be dimensionally stable during printing. Suitable materials can include polyesters, for example, poly(ethylene terephthalate) and poly(ethylene naphthalate); polyamides; polycarbonates; glassine paper; condenser paper; cellulose esters, for example, cellulose acetate; fluorine polymers, for example, poly(vinylidene fluoride), and poly(tetrafluoroethylene-co-hexafluoropropylene); polyethers, for example, polyoxymethylene; polyacetals; polystyrenes; polyolefins, for example, polyethylene, polypropylene, and methylpentane polymers; polyimides, for example, polyimide-amides and polyether-imides; and combinations thereof. The support can have a thickness of from 1 μm to 30 μm, for example, from 3 μm to 7 μm.

According to various embodiments, a subbing layer, for example, an adhesive or tie layer, a dye-barrier layer, or a combination thereof, can be coated between the support and the donor layer of the donor element. The subbing layer can be one or more layers. The adhesive or tie layer can adhere the donor layer to the support. Suitable adhesives are known to practitioners in the art, for example, Tyzor TBT® from E.I. DuPont de Nemours and Company. The dye-barrier layer can include a hydrophilic polymer. The dye-barrier layer can provide improved colorant transfer densities.

The donor element can include a slip, or slipping, layer to reduce or prevent print head sticking to the donor element during printing. The slip layer can be coated on a side of the support opposite the donor layer. The slip layer can include a lubricating material, for example, a surface-active agent, a liquid lubricant, a solid lubricant, or mixtures thereof, with or without a polymeric binder. Suitable lubricating materials can include oils or semi-crystalline organic solids that melt below 100° C., for example, poly(vinyl stearate), beeswax, perfluorinated alkyl ester polyether, poly(caprolactone), carbowax, polyethylene homopolymer, or poly(ethylene glycol). The lubricating material can also be a silicone- or siloxane-containing polymer. Suitable polymers can include graft co-polymers, block polymers, co-polymers, and polymer blends or mixtures. Suitable polymeric binders for the slip layer can include poly(vinyl alcohol-co-vinyl butyral), poly(vinyl alcohol-co-vinyl acetal), poly(styrene), poly(vinyl acetate), cellulose acetate butyrate, cellulose acetate, ethyl cellulose, the thermally conductive material described herein, and other binders as known to practitioners in the art. The amount of lubricating material used in the slip layer is dependent, at least in part, upon the type of lubricating material, but can be in the range of from 0.001 to 2 $g/m^2$, although less or more lubricating material can be used as needed. If a polymeric binder is used, the lubricating material can be present in a range of 0.1 to 50 weight %, preferably 0.5 to 40 weight %, of the polymeric binder.

The donor element can include a stick preventative agent to reduce or eliminate sticking between the donor element and the receiver element during printing. The stick preventative agent can be present in any layer of the donor element, so long as the stick preventative agent is capable of diffusing through the layers of the donor element to the donor layer, or transferring from the slip layer to the donor layer. For example, the stick preventative agent can be present in one or more patches of the donor layer, in the support, in an adhesive layer, in a dye-barrier layer, in a slip layer, or in a combination thereof. According to various embodiments, the stick preventative agent can be in the slip layer, the donor layer, or both. According to various embodiments, the stick preventative agent can be in the donor layer. The stick preventative agent can be in one or more colored patches of the donor layer, or a combination thereof. If more than one colorant patch is present in the donor layer, the stick preventative agent can be present in the last patch of the donor layer to be printed, typically the cyan layer. However, the colorant patches can be in any order. For example, if repeating patches of cyan, magenta, and yellow are used in the donor element, in that respective order, the yellow patches, as the last patches printed in each series, can include the stick preventative agent. The stick preventative agent can be a silicone- or siloxane-containing polymer. Suitable polymers can include graft co-polymers, block polymers, co-polymers, and polymer blends or mixtures. Suitable stick preventative agents are described, for example, in commonly assigned U.S. Application Publications US 2005-0059550 A1 to David G. Foster, et al., and US 2005-0059552 A1 to Teh-Ming Kung, et al.

Optionally, release agents as known to practitioners in the art can also be added to the donor element, for example, to the donor layer, the slip layer, or both. Suitable release agents include, for example, those described in U.S. Pat. Nos. 4,740,496 and 5,763,358.

According to various embodiments, the donor layer can contain no plasticizer. Inclusion of a plasticizer in the donor layer can increase donor efficiency. The donor layer can include plasticizers known in the art, such as those described in U.S. Pat. Nos. 5,830,824 and 5,750,465, and references disclosed therein. Suitable plasticizers can be defined as compounds having a glass transition temperature ($T_g$) less than 25° C., a melting point ($T_m$) less than 25° C., or both. Plasticizers useful for this invention can include low molecular weight plasticizers (average molecular weights less than about 1000) and higher molecular weight plasticizers (average molecular weights greater than about 1000) such as oligomeric or polymeric plasticizers.

The donor layer can include beads. The beads can have a particle size of from 0.5 to 20 microns, preferably from 2.0 to 15 microns. The beads can act as spacer beads under the compression force of a wound up donor roll, improving raw stock keeping of the donor roll by reducing the material transferred from the donor layer to the slipping layer, as measured by the change in sensitometry under accelerated aging conditions, or the appearance of unwanted colorant in the laminate layer, or unwanted material transfer from the backside of the donor element, for example, a slipping layer, to the donor layer. The use of the beads can result in reduced mottle and improved image quality. The beads can be employed in any amount effective for the intended purpose. In general, good results have been obtained at a coverage of from 0.003 to 0.20 $\mu m^2$. Beads suitable for the donor layer can also be used in the slip layer.

The beads in the donor layer can be crosslinked, elastomeric beads. The beads can have a glass transition temperature (Tg) of 45° C. or less, for example, 10° C. or less. The elastomeric beads can be made from an acrylic polymer or copolymer, such as butyl-, ethyl-, propyl-, hexyl-, 2-ethyl hexyl-, 2-chloroethyl-, 4-chlorobutyl- or 2-ethoxyethyl-acrylate or methacrylate; acrylic acid; methacrylic acid; hydroxyethyl acrylate; a styrenic copolymer, such as styrene-butadiene, styrene-acrylonitrile-butadiene, styrene-isoprene, or hydrogenated styrene-butadiene; or mixtures thereof. The elastomeric beads can be crosslinked with various crosslinking agents, which can be part of the elastomeric copolymer, such as but not limited to divinylbenzene; ethylene glycol diacrylate; 1,4-cyclohexylene-bis (oxyethyl) dimethacrylate; 1,4-cyclohexylene-bis (oxypropyl)diacrylate; 1,4-cyclohexylene-bis(oxypropyl) dimethacrylate; and ethylene glycol dimethacrylate. The elastomeric beads can have from 1 to 40%, for example, from 5 to 40%, by weight of a crosslinking agent.

The beads in the donor layer can be hard polymeric beads. Suitable beads can include divinylbenzene beads, beads of polystyrene crosslinked with at least 20 wt. % divinylbenzene, and beads of poly(methyl methacrylate) crosslinked with at least 20 wt. % divinylbenzene, ethylene glycol dimethacrylate, 1,4-cyclohexylene-bis(oxyethyl) dimethacrylate, 1,4-cyclohexylene-bis(oxypropyl) dimethacrylate, or other crosslinking monomers.

The donor element can be a sheet of one or more colored patches or laminate, or a continuous roll or ribbon. The continuous roll or ribbon can include one patch of a monochromatic color or laminate, or can have alternating areas of different patches, for example, one or more colorant patches of cyan, magenta, yellow, or black, one or more laminate patches, or a combination thereof. When the donor element includes a donor layer having two or more patches, the patches can be different colorants, different laminates, or a colorant and a laminate patch, and each patch independently can have a binder that is a thermally conductive material as described herein.

The receiver element suitable for use with the donor element described herein can be any receiver element as known to practitioners in the art. For example, the receiver element can include a support having thereon a dye image-receiving layer. The support can be a transparent film. Transparent supports can include cellulose derivatives, for example, a cellulose ester, cellulose triacetate, cellulose diacetate, cellulose acetate propionate, cellulose acetate butyrate; polyesters, such as poly(ethylene terephthalate), poly(ethylene naphthalate), poly(1,4-cyclohexanedimethylene terephthalate), poly(butylene terephthalate), and copolymers thereof, polyimides; polyamides; polycarbonates; polystyrene; poly(vinyl alcohol-co-vinyl acetal); polyolefins, such as polyethylene or polypropylene; polysulfones; polyacrylates; polyetherimides; and mixtures thereof. Opaque supports can include plain paper, coated paper, synthetic paper, photographic paper support, melt-extrusion-coated paper, and laminated paper, such as biaxially oriented support laminates. Biaxially oriented support laminates suitable for use as receivers can include those described in U.S. Pat. Nos. 5,853,965; 5,866,282; 5,874,205; 5,888,643; 5,888,681; 5,888,683; and 5,888,714. Biaxially oriented supports can include a paper base and a biaxially oriented polyolefin sheet, for example, polypropylene, laminated to one or both sides of a paper base. The support can be a reflective paper, for example, baryta-coated paper, white polyester (polyester with white pigment incorporated therein), an ivory paper, a condenser paper, or a synthetic paper, for example, DuPont Tyvek® by E.I. DuPont de Nemours and Company, Wilmington, Del. The support can be employed at any desired thickness, for example, from 10 μm to 1000 μm. Exemplary supports for the dye image-receiving layer are disclosed in commonly assigned U.S. Pat. Nos. 5,244,861 and 5,928,990, and in EP-A-0671281. Other suitable supports as known to practitioners in the art can also be used. According to various embodiments, the support can be a composite or laminate structure comprising a base layer and one or more additional layers. The base layer can comprise more than one material, for example, a combination of one or more of a microvoided layer, a nonvoided layer, a synthetic paper, a natural paper, and a polymer.

The dye image-receiving layer of the receiver element can be, for example, a polycarbonate, a polyurethane, a polyester, poly(vinyl chloride), poly(styrene-co-acrylonitrile), poly (caprolactone), polyvinyl acetals for example, poly(vinyl butyral) and polyvinylheptal, poly(vinyl chloride-co-vinyl acetate), poly(ethylene-co-vinyl acetate), methacrylates including those described in U.S. Pat. No. 6,362,131, or combinations thereof. The dye image-receiving layer can be coated on the receiver element support in any amount effective for the intended purpose of receiving the colorant from the donor layer of the donor element. For example, the dye image-receiving layer can be coated in an amount of from 1 $g/m^2$ to 5 $g/m^2$.

Additional polymeric layers can be present between the support and the dye image-receiving layer. The additional layers can provide coloring, adhesion, antistat properties, act as a dye-barrier, act as a colorant mordant layer, or a combination thereof. For example, a polyolefin such as polyethylene or polypropylene can be present. White pigments such as titanium dioxide, zinc oxide, and the like can be added to the polymeric layer to provide reflectivity. A subbing layer optionally can be used over the polymeric layer in order to improve adhesion to the dye image-receiving layer. This can be called an adhesive or tie layer. Exemplary subbing layers are disclosed in U.S. Pat. Nos. 4,748,150, 4,965,238, 4,965,239, and 4,965,241. An anti-static layer as known to practitioners in the art can also be used in the receiver element. The receiver element can also include a backing layer. Suitable examples of backing layers include those disclosed in U.S. Pat. Nos. 5,011,814 and 5,096,875.

The dye image-receiving layer, or an overcoat layer thereon, can contain a release agent, for example, a silicone or fluorine based compound, as is conventional in the art. Various exemplary release agents are disclosed, for example, in U.S. Pat. Nos. 4,820,687 and 4,695,286.

The receiver element can also include stick preventative agents, as described for the donor element. According to various embodiments, the receiver element and donor element can include the same stick preventative agent.

The dye image-receiving layer can be formed on the support by any method known to practitioners in the art, including but not limited to printing, solution coating, dip coating, and extrusion coating. Wherein the dye image-receiving layer is extruded, the process can include (a) forming a melt comprising a thermoplastic material; (b) extruding or coextruding the melt as a single-layer film or a layer of a composite (multilayer or laminate) film; and (c) applying the extruded film to the support for the receiver element.

The donor element and receiver element, when placed in superimposed relationship such that the donor layer of the donor element is adjacent the dye image-receiving layer of the receiver element, can form a print assembly. An image can be formed by passing the print assembly past a print head, wherein the print head is located on the side of the donor element opposite the receiver element. The print head can apply heat image-wise or patch-wise to the donor element, causing the dyes or laminate in the donor layer to transfer to the dye image-receiving layer of the receiver element.

Thermal print heads that can be used with the print assembly are available commercially and known to practitioners in the art. Exemplary thermal print heads can include, but are not limited to, a Fujitsu Thermal Head (FTP-040 MCSOO1), a TDK Thermal Head F415 HH7-1089, a Rohm Thermal Head KE 2008-F3, a Shinko head (TH300U162P-001), and Toshiba heads (TPH162R1 and TPH207R1A).

Use of the donor element including a mixture of either two immiscible or incompatible organic polymers, or a block or graft copolymer, and thermally conductive particles, as described herein, or of carbon nanotubes in a polymer, can enable high-speed printing of the print assembly, wherein high speed printing refers to printing at a line speed of 2.0 msec per line or less, for example, 1.5 msec per line or less, 1.2 msec per line or less, 1.0 msec per line or less, or 0.5 msec per line or less.

Examples are herein provided to further illustrate the invention.

EXAMPLES

Materials used in the examples include the following: CAP-482-20 (CAP) cellulose acetate propionate and CAB-381-20 (CAB) cellulose acetate butyrate from Eastman Chemical Company, Kingsport, Tenn.; Butvar™ B76 poly (vinylbutyral) (PVB) from Solutia Incorporated, St. Louis, Mo.; and Paraplex™ G25 polyester sebacate ($T_m$ −20° C., $M_w$ 8000) from CP Hall Company, IL. Other materials are set forth in individual examples.

Preparation of Alumina Dispersion D-1

A dispersion of fine particle aluminum oxide was prepared by mixing 15.0 grams of Catapal™ 200 (a boehmite alumina fine powder purchased from SASOL North America Inc., TX) with 82.0 grams toluene and 3.0 grams of Solsperse™ 24000 GR (purchased from Avecia Inc., DE) in a jar. 400 grams of zirconia silicate beads, 1.2 mm in size, were added, and the jar containing the mixture was rolled on a mill for 7 days. The zirconia silicate particles were removed by filtration. The resulting Catapal™ average particle diameter was measured to be 0.04 micrometers using a Shimadzu centrifugal particle sizer SA-CP3.

Example 1

Cyan Donor Elements

Donor Element I-1: Mixture of Two Immiscible or Incompatible Polymers and Aluminum Oxide.

A donor element was prepared by coating the following layers in the order recited on a first side of a 4.5 micron poly(ethylene terephthalate) support:

(1) a subbing layer of a titanium alkoxide (Tyzor TBT™ from E.I DuPont de Nemours and Company, DE) (0.16 $g/m^2$) from n-propyl acetate and n-butyl alcohol solvent mixture, and (2) a donor layer containing a mixture of cyan dye #1 at 0.095 $g/m^2$, cyan dye #2 at 0.086 $g/m^2$, and cyan dye #3 at 0.217 $g/m^2$, wherein the dyes are illustrated below; binder polymers CAB at 0.096 $g/m^2$ and PVB at 0.096 $g/m^2$; fine particle aluminum oxide dispersion D-1 at 0.0385 $g/m^2$; and divinyl benzene beads at 0.008 $g/m^2$, coated in a 70% toluene, 25% methanol, and 5% cyclopentanone solvent mixture.

cyan dye #1

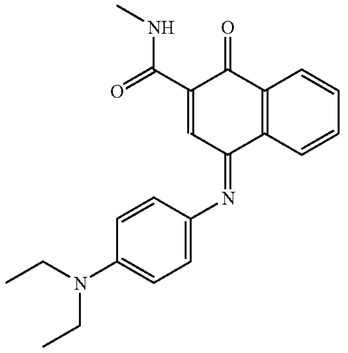

-continued cyan dye #2

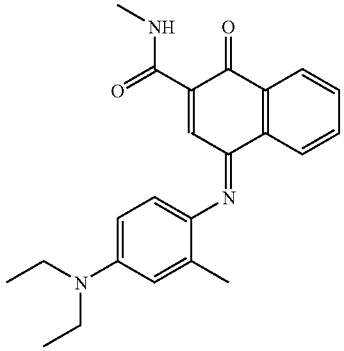

cyan dye #3

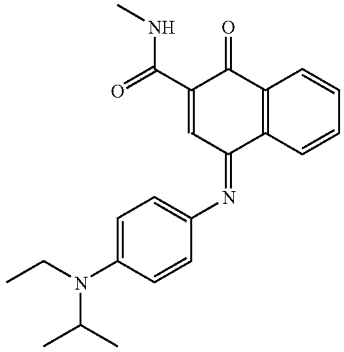

On a second side of the support, a slipping layer was prepared by coating the following layers in the order recited:

(1) a subbing layer of a titanium alkoxide (Tyzor TBT™) (0.16 g/$m^2$) from n-propyl acetate and n-butyl alcohol solvent mixture, and (2) a slipping layer containing an aminopropyl-dimethyl-terminated polydimethylsiloxane, PS513™ (United Chemical Technologies) (0.01 g/$m^2$), a poly(vinyl acetal) binder (0.38 g/$m^2$) (Sekisui KS-1), p-toluenesulfonic acid (0.0003 g/$m^2$), and candellila wax (0.02 g/$m^2$) coated from a solvent mixture of diethylketone, methanol and distilled water (88.7/9.0/2.3).

Receiver R-1 of the composition shown below was prepared, having an overall thickness of about 220 μm and a thermal dye-receiving layer thickness of about 3 μm. R-1 was prepared by solvent coating the subbing layer and dye-receiving layer onto the prepared paper support.

| Receiver Element R-1 |
|---|
| 4–8 μm divinylbenzene beads and solvent coated cross-linked polyol dye receiving layer |
| Subbing layer |
| Microvoided composite film OPPalyte™ 350 K18 (ExxonMobil) |
| Pigmented polyethylene |
| Cellulose Paper |
| Polyethylene |
| Polypropylene film |

Donor Comparative Element C-1: Mixture of Two Immiscible or Incompatible Polymers without Aluminum Oxide.

Donor comparative element C-1 was prepared the same as donor element I-1 except that CAB was at 0.115 g/$m^2$, PVB was at 0.115 g/$m^2$, and no fine particle aluminum oxide dispersion was present.

Donor Comparative Element C-2: Single Polymer Binder without Aluminum Oxide.

Donor comparative element C-2 was prepared the same as donor comparative element C-1 except that the CAB and PVB were replaced with CAP at a total of 0.231 g/$m^2$.

Donor Comparative Element C-3: Single Polymer Binder with 20% Aluminum Oxide.

Donor comparative element C-3 was prepared the same as donor comparative element C-2 except that CAP was at 0.196 g/$m^2$, and the fine particle aluminum oxide from dispersion D-1 was added at 0.0385 g/$m^2$.

Donor Comparative Element C-4: Single Polymer Binder with 40% Aluminum Oxide.

Donor comparative element C-4 was prepared the same as donor comparative element C-3 except that CAP was at 0.169 g/$m^2$, and the fine particle aluminum oxide from dispersion D-1 was at 0.0663 g/$m^2$.

Procedure

Donor element I-1 and comparative elements C-1 through C-4 were printed and evaluated as described below.

An 11-step patch image of optical density (OD) ranging from $D_{min}$ (OD<0.2) to $D_{max}$ (maximum obtained OD) was printed for donor-receiver sensitometry evaluation from each element I-1 and C1–C4. When printed using 0.52 msec/line and a resistive head voltage of 25.0 V, this is equivalent to equal energy increments ranging from a print energy of 0 Joules/$cm^2$ to a print energy of 0.63 Joules/$cm^2$. Printing was done manually as described below.

The colorant side of each donor element was placed in contact with a dye image-receiving layer of a receiver element of the same width to form a print assembly. The print assembly was fastened to a stepper motor driven pulling device. The imaging electronics were activated, causing the pulling device to draw the print assembly between the print head and a roller at a rate of about 163 mm/sec. The printing line time was 0.52 msec/line. The voltage supplied to the resistive print head was constant for a given print. A print was made at 25.0 volts, corresponding to a maximum print energy of 0.63 J/$cm^2$. After each print, the donor element and receiver element were separated manually and the Status A red reflection density of each printed step of the 11-step patch image on the receiver was measured using an X-Rite Transmission/Reflection Densitometer (model 820; X-Rite Incorporated). The values of the red density at the print energy of 0.63 J/$cm^2$ obtained when printing each donor element to the receiver element are reported in the table below. The % alumina is calculated as: (weight fine particle alumina divided by the total weight of binder polymer) multiplied by 100.

RED DENSITY

| Element | Binder composition | Density at 0.63 J/$cm^2$ | % increase in density relative to C-2 | % alumina |
|---|---|---|---|---|
| I-1 | CAB/PVB 1/1 with 20% Alumina | 0.9 | 15.4 | 20 |
| C-1 | CAB/PVB1/1 | 0.81 | 3.8 | 0 |
| C-2 | CAP | 0.78 | NA | 0 |
| C-3 | CAP with 20% alumina | 0.84 | 7.7 | 20 |
| C-4 | CAP with 40% alumina | 0.9 | 15.4 | 39 |

The above results show that when fine particle alumina is added to the dye donor layer, higher optical print densities can be obtained for the same input energy than what can be obtained when no fine particle alumina is added. The increased densities achieved by I-1 can be a critical advantage when printing at faster speeds. The above example also demonstrates that, to achieve the same increase in print density while obtaining similar results, a lower amount of fine particle alumina is needed when added to a binder comprising a blend of immiscible or incompatible polymers (I-1) than when added to a binder consisting of a single polymer species (C-4), which would be a cost advantage. The increase in print density is shown to be greater than additive as compared to combining the increase due to the mixture of two polymers (C-1) and the increase due to the addition of the same amount fine particle alumina to the single polymer binder (C-3).

The invention has been described in detail with particular reference to certain preferred embodiments thereof, but it will be understood that variations and modifications can be effected within the spirit and scope of the invention.

The invention claimed is:

1. A thermally conductive material comprising at least two immiscible or incompatible organic polymers, or a block or graft copolymer wherein the constituent blocks or grafts are prepared from chemical species that would form mutually immiscible or incompatible polymers, and thermally conductive particles having a short axis of less than or equal to 0.2 microns, wherein the thermally conductive particles comprise metal oxides, carbon nanotubes, metal nanowires, or a mixture thereof.

2. The material of claim 1, wherein at least a portion of the thermally conductive particles comprise carbon nanotubes.

3. The material of claim 2, wherein the carbon nanotubes are single-walled or multi-walled carbon nanotubes, or a combination thereof.

4. The material of claim 1, wherein at least a portion of the thermally conductive particles comprise aluminum oxide.

5. The material of claim 1, wherein the thermally conductive particles are present in an amount of 20 weight percent or less of the material.

6. The material of claim 1, wherein each of the at least two polymers is independently selected from cellulose derivatives, polyvinylacetals, vinyl-chloride-containing polymers, styrene-containing polymers.

7. The material of claim 1, wherein the mixture comprises three polymers.

8. The material of claim 7, wherein at least two of the polymers are immiscible or incompatible with respect to one another.

9. The material of claim 1, wherein the weight percent ratio of first polymer to second polymer is from 10/90 to 90/10 by weight.

10. The material of claim 1, wherein the weight percent ratio of first polymer to second polymer is from 25/75 to 75/25 by weight.

11. A thermal donor element comprising a support, a donor layer, and optionally a slip layer on a side of the substrate opposite the donor layer, wherein the thermal donor element includes a thermally conductive material comprising at least two immiscible or incompatible organic polymers, or a block or graft copolymer wherein the constituent blocks or grafts are prepared from chemical species that would form mutually immiscible or incompatible polymers, and thermally conductive particles having a short axis of less than or equal to 0.2 microns, wherein the thermally conductive particles comprise metal oxides, carbon nanotubes, metal nanowires, or a mixture thereof.

12. The thermal donor element of claim 11, wherein the donor layer, the slip layer, or both, comprise the thermally conductive material.

13. The thermal donor element of claim 11, wherein the donor layer comprises one or more colorant patches, each patch including one or more colorant.

14. The thermal donor element of claim 11, wherein the donor layer comprises of at least one laminate patch.

15. The thermal donor element of claim 11, wherein at least a portion of the thermally conductive particles comprise carbon nanotubes.

16. The thermal donor element of claim 15, wherein the carbon nanotubes are single-walled or multi-walled carbon nanotubes, or a combination thereof.

17. The thermal donor element of claim 11, wherein at least a portion of the thermally conductive particles comprise alumina or aluminum oxide.

18. The thermal donor element of claim 11, wherein the thermally conductive particles are present in an amount of 20 weight percent or less of the dye-donor layer.

19. The thermal donor element of claim 11, wherein each of the at least two polymers is independently selected from cellulose derivatives, polyvinylacetals, vinyl-chloride-containing polymers, styrene-containing polymers.

20. The thermal donor element of claim 11, wherein the mixture comprises three polymers.

21. The thermal donor element of claim 20, wherein at least two of the polymers are immiscible or incompatible with respect to one another.

22. The thermal donor element of claim 11, wherein the weight percent ratio of first polymer to second polymer is from 10/90 to 90/10 by weight.

23. The thermal donor element of claim 11, wherein the weight percent ratio of first polymer to second polymer is from 25/75 to 75/25 by weight.

24. A thermal transfer assembly, comprising the donor of claim 11 and a thermal receiver.

25. The assembly of claim 24, wherein the receiver comprises an extruded dye image-receiving layer.

26. A method of printing an image comprising image-wise transferring colorant from the donor element of claim 11 to a receiver element.

27. The method of claim 26, having a print speed of 2 ms/line or less.

28. The method of claim 26, having a print speed of 1 ms/line or less.

* * * * *

UNITED STATES PATENT AND TRADEMARK OFFICE

CERTIFICATE OF CORRECTION

PATENT NO. : 7,211,364 B1

APPLICATION NO. : 11/256253

DATED : May 1, 2007

INVENTOR(S) : Christine J. Landry-Coltrain et al.

It is certified that error appears in the above-identified patent and that said Letters Patent is hereby corrected as shown below:

| | |
|---|---|
| Title Page, item [54] Col. 1 (Title), Line 1 | Delete "CONDUCIVE" and insert -- CONDUCTIVE --. |
| Column 1, Line 1 | Delete "CONDUCIVE" and insert -- CONDUCTIVE --. |

Signed and Sealed this

Sixth Day of May, 2008

JON W. DUDAS

*Director of the United States Patent and Trademark Office*